(12) United States Patent
Mansoori et al.

(10) Patent No.: US 6,830,980 B2
(45) Date of Patent: Dec. 14, 2004

(54) SEMICONDUCTOR DEVICE FABRICATION METHODS FOR INHIBITING CARBON OUT-DIFFUSION IN WAFERS HAVING CARBON-CONTAINING REGIONS

(75) Inventors: Majid Movahed Mansoori, Plano, TX (US); Donald S. Miles, Plano, TX (US); Srinivasan Chakravarthi, Richardson, TX (US); P R Chidambaram, Richardson, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 10/393,419

(22) Filed: Mar. 20, 2003

(65) Prior Publication Data
US 2004/0185629 A1 Sep. 23, 2004

(51) Int. Cl.[7] ........................................... H01L 21/336
(52) U.S. Cl. ..................................................... 438/308
(58) Field of Search ................. 438/308, 558, 438/920

(56) References Cited

U.S. PATENT DOCUMENTS

| | | | |
|---|---|---|---|
| 5,185,280 A | | 2/1993 | Houston et al. |
| 6,030,874 A | | 2/2000 | Grider et al. |
| 6,096,617 A | | 8/2000 | Kizuki |
| 6,153,920 A | * | 11/2000 | Gossmann et al. ......... 257/607 |
| 6,306,712 B1 | | 10/2001 | Rodder et al. |
| 2002/0033511 A1 | | 3/2002 | Babcock et al. |
| 2002/0151153 A1 | | 10/2002 | Drobny et al. |

* cited by examiner

Primary Examiner—David Nelms
Assistant Examiner—Quoc Hoang
(74) Attorney, Agent, or Firm—Peter K. McLarty; W. James Brady, III; Frederick J. Telecky, Jr.

(57) ABSTRACT

Semiconductor device fabrication methods are provided in which a carbon-containing region is formed in a wafer to inhibit diffusion of dopants during fabrication. Front-end thermal processing operations, such as oxidation and/or anneal processes, are performed at high temperatures for short durations in order to mitigate out-diffusion of carbon from the carbon-containing region, such that carbon remains to inhibit or mitigate dopant diffusion.

38 Claims, 6 Drawing Sheets

SEMICONDUCTOR DEVICE FABRICATION METHODS FOR INHIBITING CARBON OUT-DIFFUSION IN WAFERS HAVING CARBON-CONTAINING REGIONS

FIELD OF INVENTION

The present invention relates generally to semiconductor devices and more particularly to manufacturing semiconductor devices using carbon-containing regions formed in a wafer.

BACKGROUND OF THE INVENTION

MOS and other types of transistors are found in many modern semiconductor products where switching and/or amplification functions are needed. Many manufacturing processes and techniques have been developed for forming MOS transistors and other electrical components in semiconductor substrate materials such as silicon and the like to produce semiconductor devices. In recent years, the size of transistors and other components have steadily decreased to submicron levels in order to facilitate higher device densities in semiconductor products. At the same time, many applications of such devices have created a need to operate the semiconductor devices at higher speeds and lower power and voltage levels.

In fabricating transistor devices, various regions of semiconductor material are selectively doped with impurities to create 'p-type' or 'n-type' regions, such as wells, source/drain regions, lightly-doped drain (LDD) regions, pocket or halo regions, etc., where the type (e.g., 'p' or 'n') depends upon the dopants employed. P-type regions are typically created using dopants such as boron, indium or others, whereas n-type regions are created using phosphorus, arsenic, antimony, etc. Such doping is generally accomplished through dopant diffusion techniques and/or through implantation processes, whereby dopants of a desired concentration are ideally provided to specific regions or areas of a semiconductor body. This selective doping allows semiconductor devices, such as transistors to be fabricated in a controlled and repeatable fashion to achieve desired operating performance specifications.

However, dopants tend to relocate through thermal diffusion in a semiconductor material, causing difficulties in the manufacture of semiconductor devices, and potentially degrading device performance. For instance, dopant out-diffusion from shallow junction extension and pocket or halo implanted regions of MOS transistors during thermal processing can degrade the achievable transistor drive current capability by reducing mobility in the channel region underlying the transistor gate. Accordingly, the locations and concentrations of such dopants may be tailored according to the thermal processing that a semiconductor wafer experiences after the dopants are introduced. In this manner, desired dopant location and concentrations can be achieved when the fabrication process is completed. However, the ability to control exact concentrations and locations of dopants is made more difficult by the tendency of dopants to diffuse during thermal manufacturing processing steps.

In order to inhibit the diffusion of dopants in a semiconductor body, diffusion barriers or regions of diffusion inhibiting materials may be formed in certain regions of the semiconductor material. For instance, carbon-containing regions may be formed for inhibiting or mitigating dopant diffusion, such as layers of carbon-containing epitaxial silicon or regions of a semiconductor body implanted with carbon-containing species. However, the effectiveness of the carbon-containing region with respect to inhibiting dopant diffusion is dependent upon the location and concentration of carbon. Moreover, the presence of carbon in certain regions or locations of a semiconductor body may adversely affect device performance or the ability to process a wafer during manufacturing. In this regard, the accumulation of carbon at or near the surface of a wafer tends to reduce the oxidation rate, leading to higher overall manufacturing thermal budget required to achieve a desired oxide thickness, including oxidation process steps used in forming a gate dielectric. Accordingly, there is a need for improved methods and techniques for semiconductor device fabrication, by which carbon-doped regions can be successfully employed to control dopant diffusion during the manufacture of semiconductor devices.

SUMMARY OF THE INVENTION

The following presents a simplified summary in order to provide a basic understanding of one or more aspects of the invention. This summary is not an extensive overview of the invention, and is neither intended to identify key or critical elements of the invention, nor to delineate the scope thereof. The invention relates to semiconductor device fabrication methods in which a carbon-containing region is formed in a wafer to inhibit or mitigate diffusion of dopants during fabrication.

The inventors have appreciated that the provision of carbon or carbon-containing species to a region of a semiconductor body (e.g., through implantation or other techniques) generally results in both substitutional carbon and interstitial carbon, where interstitial carbon in particular tends to out-diffuse from its original location during thermal processing. As discussed above, the out-diffusion/deactivation of carbon reduces the ability to inhibit thermal out-diffusion of dopants (e.g., boron, phosphorus, or others) during the manufacturing process. In addition, the carbon out-diffusion or deactivation may lead to subsequent generation of surface defects, reduced oxidation rates, or otherwise adversely impact operations affecting the wafer surface.

In the present invention, front-end thermal processing operations, including oxidation and/or anneal processes, are performed at high temperatures for short durations in order to mitigate out-diffusion of carbon from the carbon-containing region, such that carbon remains to inhibit or reduce dopant diffusion. The invention may be employed to provide increased control of dopant location and concentration to thereby facilitate control and repeatability of semiconductor device performance. In addition, the invention may be used to prevent or mitigate diffusion of carbon to the surface of a wafer, and thus to facilitate expeditious oxidation rates during manufacturing.

In one aspect of the invention, a method of fabricating a semiconductor device is provided, comprising forming a carbon-containing region in the wafer, and performing at least one front-end oxidation or anneal process using a high temperature, short duration thermal process to mitigate out-diffusion of carbon from the carbon-containing region during front-end fabrication processing. The carbon-containing region may be formed by any technique, including but not limited to implanting carbon or a carbon-containing species in the wafer or growing an epitaxial carbon-containing layer over a semiconductor body, with or without an overlying epitaxial cap layer.

The short duration, high temperature oxidations may include formation of a pad oxide layer and/or a liner oxide layer during isolation processing (e.g., shallow trench isolation (STI) processing), and/or formation of a gate oxide or gate dielectric layer during front-end processing. In one implementation, the elevated temperature oxidations may be performed at temperatures of about 1000 degrees C. or more for a duration of about 60 seconds or less, at a pressure of about 10 Torr or less. The front end processing may alternatively or in combination comprise performing an anneal, such as a channel implant damage anneal process at a temperature of about 1050 degrees C. or more for a duration of about 60 seconds or less. The front-end thermal processing, moreover, may include in-situ steam generation oxidation or anneal processes. The invention thus provides for reducing the overall front-end thermal budget of a semiconductor device manufacturing process, which may be employed to inhibit carbon out-diffusion or deactivation, by which the prevention or reduction in the amount of dopant out-diffusion or relocation can be achieved.

The following description and annexed drawings set forth in detail certain illustrative aspects and implementations of the invention. These are indicative of but a few of the various ways in which the principles of the invention may be employed.

DETAILED DESCRIPTION OF THE INVENTION

Figure 1:
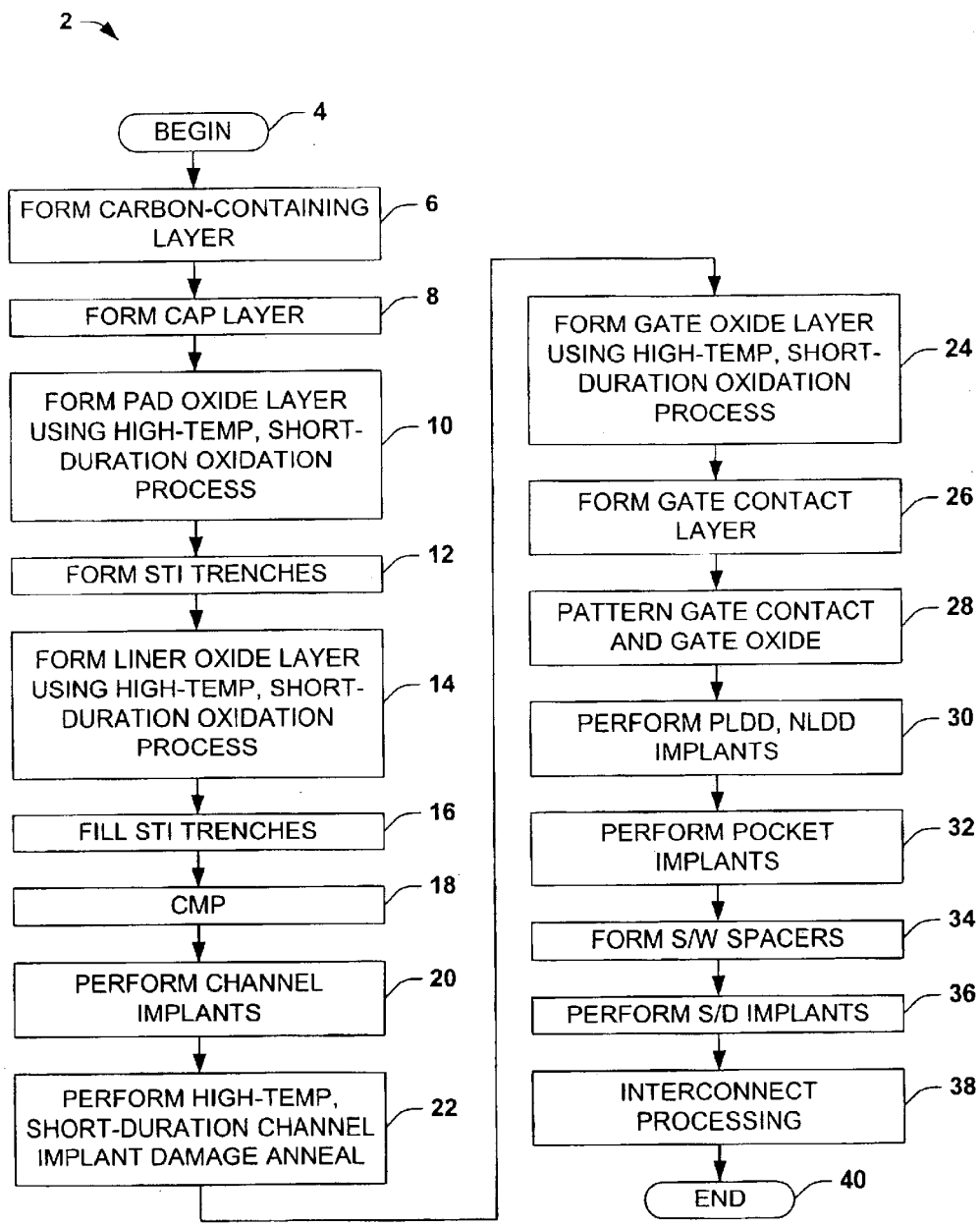
FIG. 1 is a flow diagram illustrating an exemplary method of fabricating semiconductor devices in accordance with one or more aspects of the present invention.

One or more exemplary implementations of the present invention are described below with reference to the attached drawings, wherein like reference numerals are used to refer to like elements throughout. The invention relates to methods for fabricating semiconductor devices with carbon-containing regions, in which front-end oxidation and/or anneal operations are performed at high temperatures for short durations in order to mitigate out-diffusion of carbon from the carbon-containing region, such that carbon remains to inhibit or mitigate dopant diffusion.

Various aspects of the invention are hereinafter illustrated and described in the context of semiconductor wafers having an epitaxially grown carbon-containing layer with an optional epitaxial silicon layer formed over the carbon-containing layer. However, the invention finds utility in applications having any sort of carbon-containing region formed by any appropriate technique, such as semiconductor bodies having regions implanted with carbon or carbon-containing species, wherein all such variants are contemplated as falling within the scope of the invention and the appended claims. In addition, although illustrated and described in the context of inhibiting boron diffusion from pocket or halo implant regions of an NMOS transistor device, the invention may also be employed in situations where carbon-containing regions are used to inhibit diffusion or other relocation of any dopant species, n-type and/or p-type, where the carbon-containing region may be located anywhere in a semiconductor device wafer, whether beneath the surface or at the surface thereof. Furthermore, it is noted at the outset that the structures illustrated in the various drawing figures are not necessarily drawn to scale.

Referring initially to FIG. 1, an exemplary method 2 is illustrated for fabricating a semiconductor device in a wafer in accordance with one or more aspects of the invention. Although the method 2 is illustrated and described below as a series of acts or events, it will be appreciated that the present invention is not limited by the illustrated ordering of such acts or events. For example, some acts may occur in different orders and/or concurrently with other acts or events apart from those illustrated and/or described herein, in accordance with the invention. In addition, not all illustrated steps may be required to implement a methodology in accordance with the present invention. Further, the methods according to the present invention may be implemented in association with the formation and/or processing of structures illustrated and described herein as well as in association with other structures and devices not illustrated. Moreover, the method 2 is illustrated in somewhat simplified form, wherein other steps may be performed, which are not specifically illustrated or described herein.

Beginning at 4, the method 2 comprises forming a carbon-containing region in the wafer at 6, which is a carbon-containing epitaxial silicon layer grown over a semiconductor body in the illustrated example. In other implementations of the invention, a carbon-containing region may be formed by implanting carbon or a carbon-containing species in the wafer. The method 2 may be carried out beginning with a silicon substrate, SOI wafer, or other semiconductor body. At 6, a carbon layer, a carbon doped silicon layer, or a silicon-germanium-carbon (SiGeC) layer is formed over the wafer surface, for example, having a carbon concentration of about 0.1 atomic percent or more. The carbon-containing layer is formed at 6 to a layer thickness between about 10 and 1000 Å, for example, about 100–500 Å. However, other concentrations and layer thicknesses are possible within the scope of the invention.

Following the formation of the carbon-containing layer at 6, a silicon epitaxial cap layer may optionally be formed at 8 over the carbon-containing layer. Where an epitaxial growth process is employed, the carbon-containing layer and the cap layer may be formed sequentially in a continuous process, for example, in a rapid thermal chemical vapor deposition (CVD) tool. In this case, the process chemistry may be changed between steps 6 and 8, for instance, to stop incorporating carbon or carbon-containing species in the process chemistry, such that the cap layer at 8 contains little or no carbon. In the illustrated example, the cap layer is formed at 8 to a thickness of about 400–500 Å. In other variants, the cap layer can be of any appropriate thickness and composition, or may be omitted altogether within the scope of the invention.

In another possible implementation, the carbon-containing region can be formed through implantation of carbon or carbon-containing species in the semiconductor body. Any appropriate implantation parameters, such as concentration and implantation energy may be employed in accordance with the invention, wherein the region of interest may be provided with a carbon concentration of about 0.1 atomic percent or more in one example, and wherein the thickness of the carbon-containing region can be about 10–1000 Å, such as about 100–500 Å. For example, where it is desired to control dopant diffusion into a transistor channel region, the carbon-containing region can be situated directly beneath the channel or any desired depth below the channel. Alternatively, the carbon-containing region implant can be performed in selective fashion, and may be done at an angle, so as to provide a carbon-containing region anywhere in the wafer to prevent or inhibit dopant diffusion from any doped region to a protected region of interest in accordance with the present invention. In the illustrated example, the carbon-containing region is provided to prevent or inhibit dopant diffusion into the prospective transistor channel region. However, carbon-containing regions may alternatively or in combination be provided via formation of carbon-containing layers and/or implantation of carbon or carbon-containing species to prevent or inhibit dopant diffusion out of any region of a semiconductor device, including but not limited to shallow junction extension regions (e.g., LDD, HDD, etc.), deep source/drain regions, doped gate structures, or other regions within the scope of the invention.

The invention further contemplates performing at least one front-end oxidation or anneal process using a high temperature, short duration thermal process to mitigate out-diffusion of carbon from the carbon-containing region during front-end fabrication processing. In the exemplary method 2, a pad oxide layer is formed at 10 using such an oxidation process at a temperature of about 1000 degrees C. or more for a duration of about 60 seconds or less, although other elevated temperatures and short durations are contemplated as falling within the scope of the invention. In another example, the pad oxide layer is formed through oxidation at about 1050 degrees C. or more, preferably about 1100 degrees C. or more for a duration of less than 60 seconds, such as about 30 seconds or less. In addition, the pad oxide process at 10 may be performed at a pressure of about 10 Torr or less. In one implementation, the process at 10 is an in-situ steam generation (ISSG) oxidation process. The pad oxide layer may be grown to any desired thickness at 10, which functions to relieve stress between the underlying semiconductor body (e.g., the carbon-containing epitaxial layer or the epitaxial cap layer in this example) and a hard mask nitride layer formed thereover for shallow trench isolation (STI) processing. In this regard, a nitride layer may be formed over the pad oxide layer at 10, wherein the nitride layer operates as a hard mask in subsequent isolation processing, and may be formed using any appropriate deposition techniques and materials, such as $Si_3N_4$ deposited by low pressure chemical vapor deposition (LPCVD).

Isolation trenches are then formed at 12, to be subsequently filled with insulating material as part of the STI processing, wherein the trench formation at 12 may include any appropriate processing. In one example, a resist layer is formed over the nitride layer and patterned to form a patterned mask exposing isolation regions of the nitride layer, while covering active regions thereof, in which the patterning of the resist mask may be done according to any appropriate photolithography techniques. An isolation trench may then be dry etched using the patterned mask using any appropriate etching techniques such as reactive ion etching (RIE). For example, a single or multi-step RIE etch process may be performed which removes material in the exposed isolation regions so as to etch through the nitride layer, the underlying pad oxide, and into the epitaxial carbon-containing and cap layers, and which may proceed to etch into the underlying semiconductor body to form a trench.

Once the trenches are formed at 12, a liner oxide layer is formed at 14 using a high temperature, short duration oxidation process in accordance with the invention. In the illustrated implementation, the liner oxide layer is formed through oxidation of the trench bottom and sidewalls at 14 at a temperature of about 1000 degrees C. or more for a duration of about 60 seconds or less, although other elevated temperatures and short durations are contemplated as falling within the scope of the invention. In another example, the liner oxide layer is formed through oxidation at about 1050 degrees C. or more, preferably about 1100 degrees C. or more for a duration of less than 60 seconds, such as about 30 seconds or less. In addition, the liner oxide process at 14 may be performed at a pressure of about 10 Torr or less, wherein the process at 14 may be an in-situ steam generation (ISSG) oxidation process.

Thereafter at 16, the STI trenches are filled with dielectric material such as $SiO_2$ or other electrically isolating material so as to provide electrical isolation between active regions on either side of the isolation trench. The trench filling operation at 16 may comprise forming or depositing dielectric material over the wafer to cover the nitride layer in the active regions and to fill the trenches in the isolation regions thereof. The trench fill material may be deposited at 16 using any appropriate deposition techniques, for example, such as high density plasma (HDP) oxide deposition, low pressure chemical vapor deposition (LPCVD) employing a tetraethylorthosilicate (TEOS) gas, or plasma enhanced chemical vapor deposition (PECVD) of silicon dioxide from TEOS and oxygen mixtures (PETEOS).

The wafer is then planarized at 18 to expose a portion of the nitride layer in the active regions, leaving a generally planar upper surface with portions of the nitride layer and a remaining portion of the fill material in the trenches exposed. The remaining nitride material is then stripped or removed at 18, for example, using a wet etch process selective so as to remove nitride material and to stop on the pad oxide layer without damaging the underlying cap layer material in the active regions of the device. Thereafter, the pad oxide layer may be removed using an oxide deglaze or other suitable oxide removal operation at 18. Although illustrated and described in association with STI type isolation, other isolation processes and techniques are possible within the scope of the invention, for example, including local oxidation of silicon (LOCOS). Following the STI isolation processing, one or more wells may be performed, such as using suitable implantation masks and processes, for example to form p-wells for NMOS transistors and n-wells for PMOS transistors, wherein multiple implants (e.g., channel stop and punch-thru implants) may be used to form retrograde wells.

One or more channel implants are then performed at 20 to provide dopants to the semiconductor body, the epitaxial carbon-containing silicon layer, and/or to the epitaxial silicon cap layer. In this regard, it is noted that the some portion or all of the cap layer may have been consumed in the pad oxide layer oxidation process at 10. The channel implants may comprise threshold voltage adjustment (e.g., Vt adjust) implants, and other implantations providing dopants (e.g., n and/or p type) to optimize the channel region of prospective MOS transistors, which may be selectively performed using appropriate masks and dopant types. For example, one or more Vtn implants may be performed at 20 to provide p-type dopants (e.g., boron or other p-type species) to prospective NMOS regions of the wafer, with other regions masked. Also at 20, Vtp implants may be performed to implant n-type dopants (e.g., phosphorus, arsenic, or other n-type species) to prospective PMOS regions, with the NMOS and other regions masked. In this regard, any suitable channel implants may be performed at 20, using appropriate implantation doses, energies, and other process parameters within the scope of the invention.

Following the channel implants at 20, a channel implant damage anneal process is performed at 22 at high temperature for a short duration. In the exemplary implementation, the channel implant damage anneal is performed at a temperature of about 1050 degrees C. or more and a pressure of about 10 Torr or less for a duration of about 60 seconds or less to mitigate or inhibit out-diffusion of carbon from the carbon-containing region during front-end fabrication processing. In another possible implementation, the anneal process at 22 is performed at a temperature of about 1100 degrees C. or more for a duration of about 60 seconds or less, preferably for about 30 seconds or less. Also, the anneal at 22 may be an in-situ steam generation anneal process according to the present invention.

Continuing at 24, a gate oxide or gate dielectric layer is formed using an oxidation process at an elevated temperature for a short duration, for example, using a temperature of about 1000 degrees C. or more for a duration of about 60 seconds or less. Other temperatures and durations are contemplated as falling within the scope of the invention. For example, the gate oxide layer may be formed at 24 through oxidation at about 1050 degrees C. or more, preferably about 1100 degrees C. or more for a duration of less than 60 seconds, such as about 30 seconds or less in one implementation. In addition, the gate oxide process at 24 may be performed at a pressure of about 10 Torr or less. In one implementation, the process at 24 is an in-situ steam generation (ISSG) oxidation process. Further, the gate oxide layer may be grown to any desired thickness at 24 depending upon a given transistor gate design, and may comprise any type of gate oxide material, including but not limited to nitrided oxide materials, or others. The gate oxide layer formation at 24, moreover, may be part of a multi-step gate dielectric structure formation process flow in accordance with the invention. In one example, an interface oxide layer may be formed using the high-temperature, short duration oxidation process, with one or more high-k dielectric layers being formed over the interface oxide layer at 24.

Thereafter, a gate contact layer is formed over the wafer using conductive metal or polysilicon or other suitable material to any desired thickness. In one example, the gate contact layer is formed by deposition of polysilicon over the high-k material or the thermally grown gate oxide at 26. Thereafter at 28, the gate contact layer, and the gate oxide layer or layers are patterned to form a transistor gate structure. At 30, LDD or extension region implants are performed to provide dopants to the prospective source/drain regions on either side of the gate structures, using the patterned gate structures to self align the implanted LDD or extension regions with the gate. At 32, pocket or halo implants are performed using higher implantation energies than the corresponding LDD implants, to form oppositely doped pockets, preferably between the implanted LDD regions and the device channel. Thereafter at 34, sidewall spacers are formed along the gate sidewalls, source/drain implants are performed at 36 using appropriate dose and energy parameters according to the desired transistor design, and interconnect processing is performed at 38 according to any suitable interconnect techniques, before the method 2 ends at 40.

It is noted in the exemplary method 2, that high-temperature, short-duration oxidation operations are employed for the front-end oxidation processes used in forming the pad oxide, liner oxide, and gate oxide layers, and that elevated temperature, short duration processing is used at 22 for channel implant damage annealing. Other implementations are possible within the scope of the invention, wherein one, some, or all front end oxidation and/or anneal processes are performed at elevated temperatures for short durations. In this regard, the invention contemplates such thermal processing for any front-end oxidation or annealing processes occurring prior to gate patterning, including front-end oxidations and/or anneals not illustrated and described herein.

Figure 2:
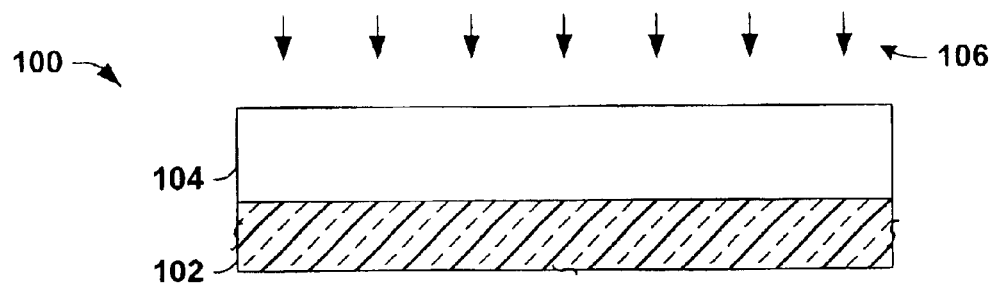
FIG. 2 is a partial side elevation view in section illustrating formation of a carbon-containing layer over a silicon substrate in an exemplary semiconductor device.
Figure 3:
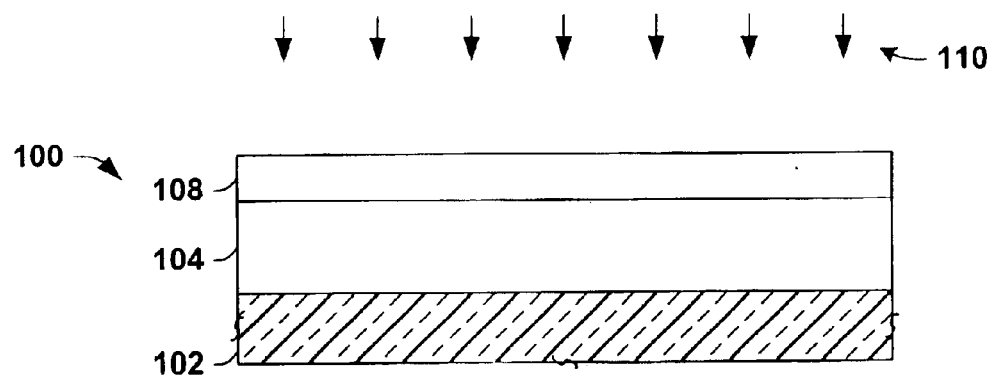
FIG. 3 is a partial side elevation view in section illustrating formation of a cap layer over the carbon-containing layer in the device of FIG. 2.

Referring also to FIGS. 2–17 various aspects of the invention are exemplified in a semiconductor device 100 illustrated and described hereinafter at various stages of fabrication. The exemplary NMOS transistor device 100 is formed in a wafer comprising a semiconductor body 102, which is a silicon substrate in the illustrated example. Other implementations of the invention are possible using any type of semiconductor body, such as SOI wafers or other semiconductor substrates. In FIG. 2, a carbon-containing region 104 is formed over the semiconductor body using a deposition process 106 (e.g., step 6 in FIG. 1). The exemplary process 106 is a rapid thermal chemical vapor deposition (CVD) process providing a carbon-containing epitaxial silicon layer 104 over the semiconductor body 102 to a thickness between about 10 and 1000 Å, for example, about 100–500 Å, although other processes may be performed in accordance with the invention. In FIG. 3, a silicon epitaxial cap layer 108 may optionally be formed over the carbon-containing layer 104 using the same process 106 or a different deposition process 110 (e.g., step 8 above). In the device 100, the cap layer 108 is formed to a thickness of about 400–500 Å. In other variants, the cap layer can be of any appropriate thickness and composition, or may be omitted altogether within the scope of the invention.

Figure 4:
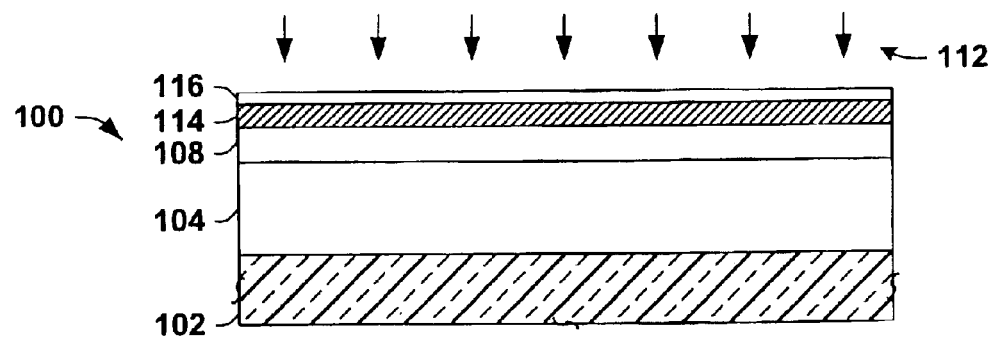
FIG. 4 is a partial side elevation view in section illustrating formation of a pad oxide layer using a high temperature, short duration oxidation process in accordance with an aspect of the invention, as well as formation of an overlying nitride layer in the device of FIGS. 2 and 3.
Figure 5:
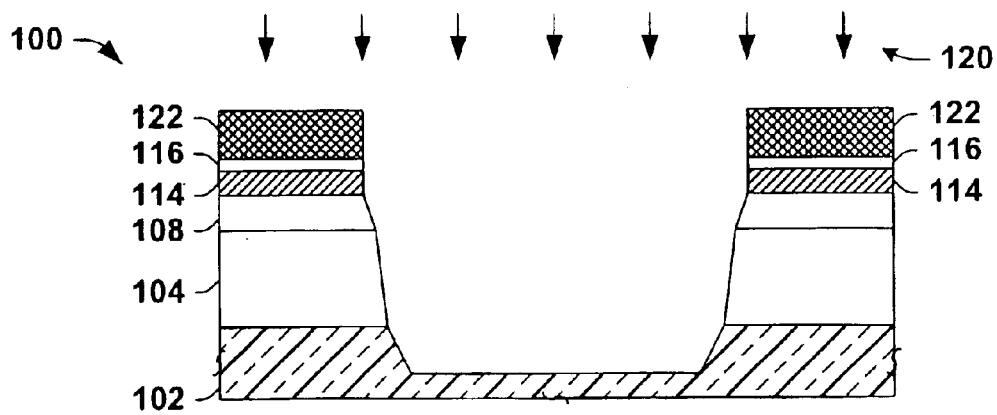
FIG. 5 is a partial side elevation view in section illustrating formation of an isolation trench in the device of FIGS. 2–4.

In FIG. 4, a high temperature, short duration thermal process 112 is employed to form a pad oxide layer 114 (e.g., step 10 above), for example, through oxidation at a temperature of about 1000 degrees C. or more for a duration of about 60 seconds or less at a pressure of about 10 Torr or less, and a nitride layer 116 is formed over the pad oxide layer 114. In one implementation, the process at 112 is an in-situ steam generation (ISSG) oxidation process, wherein the pad oxide layer 114 may be grown to any desired thickness. Thereafter in FIG. 5, isolation trenches are then formed using an STI trench formation process 120, in which a resist layer 122 is formed over the nitride layer 116 and is patterned to form a mask exposing isolation regions of the nitride layer 116, while covering active regions thereof. The isolation trench is then dry etched using the patterned mask 122 using any appropriate etching techniques such as reactive ion etching (RIE), which may be a single or a multi-step RIE etch process 120. The process 120 removes material in the exposed isolation regions so as to etch through the nitride layer 116, the underlying pad oxide 114, and into the epitaxial carbon-containing and cap layers 104 and 108, respectively. In the illustrated example, moreover, the trench formation etch process 120 proceeds to etch into the underlying semiconductor body 102 to form the trench.

Figure 6:
FIG. 6 is a partial side elevation view in section illustrating formation of a liner oxide layer in the isolation trench using a high temperature, short duration oxidation process in accordance with another aspect of the invention in the device of FIGS. 2–5.
Figure 7:
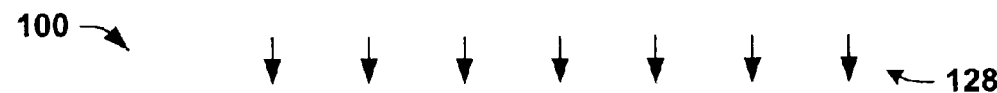
FIG. 7 is a partial side elevation view in section illustrating formation of an isolation structure in the trench of the device of FIGS. 2–6.

In FIG. 6, a liner oxide layer 124 is formed (e.g., step 14 above) using a high temperature, short duration oxidation process 126 in accordance with the invention. In the illustrated implementation, the liner oxide layer 124 is formed through oxidation of the trench bottom and sidewalls at a temperature of about 1000 degrees C. or more for a duration of about 60 seconds or less. However, other elevated temperatures and short durations are contemplated as falling within the scope of the invention, for example, wherein the liner oxide process 126 may be performed at a pressure of about 10 Torr or less, and wherein the process 126 may be an ISSG oxidation process. Thereafter in FIG. 7, the STI trenches are filled with dielectric material 130, such as $SiO_2$ or other electrically isolating material, using a deposition process 128, such as HDP, LPCVD, PECVD, or other suitable deposition processes. Thereafter, the wafer is planarized, and the remaining nitride material 116 and the pad oxide layer 114 are removed, as illustrated in FIG. 7. Following the STI isolation processing, one or more wells (not shown) may be performed, such as using suitable implantation masks and processes, for example to form p-wells for NMOS transistors and n-wells for PMOS transistors, wherein multiple implants (e.g., channel stop and punch-thru implants) may be used to form retrograde wells.

Figure 8:
FIG. 8 is a partial side elevation view in section illustrating performance of one or more channel implants in the device of FIGS. 2-7.
Figure 9:
FIG. 9 is a partial side elevation view in section illustrating performance of a high temperature, short duration channel damage anneal in the device of FIGS. 2–8.
Figure 10:
FIG. 10 is a partial side elevation view in section illustrating formation of a gate oxide layer using a high temperature, short duration oxidation process in accordance with yet another aspect of the invention in the device of FIGS. 2–9.
Figure 11:
FIG. 11 is a partial side elevation view in section illustrating formation of a gate contact layer over the gate oxide layer in the device of FIGS. 2–10.
Figure 12:
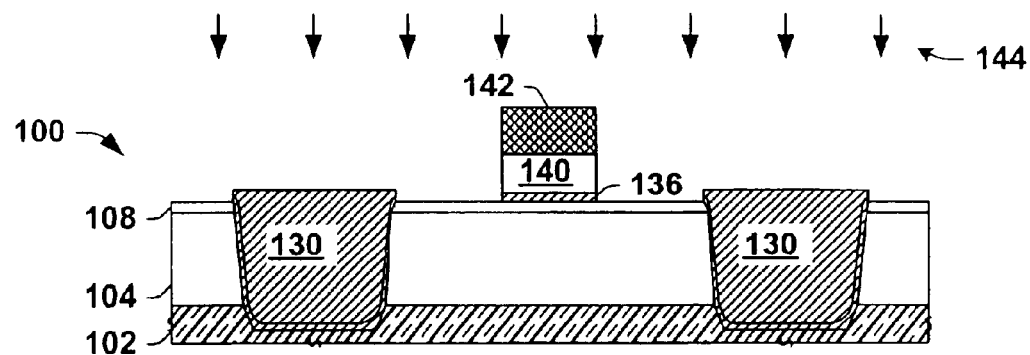
FIG. 12 is a partial side elevation view in section illustrating patterning of the gate oxide and gate contact layers to form a gate structure in the device of FIGS. 2–11.

In FIG. 8, one or more channel implants adjustment (e.g., Vt adjust implants) are performed via one or more implantation processes 132 to provide dopants to the semiconductor body 102, the epitaxial carbon-containing silicon layer 104, and/or the epitaxial silicon cap layer 108. Thereafter in FIG. 9, a channel implant damage anneal process 134 is performed (e.g., step 22 above) at a high temperature for a short duration. For example, the channel implant damage anneal 134 may be performed at a temperature of about 1050 degrees C. or more and a pressure of about 10 Torr or less for a duration of about 60 seconds or less to mitigate or inhibit out-diffusion of carbon from the carbon-containing layer 104, wherein the anneal 134 may be an ISSG process. In FIG. 10, a gate oxide or gate dielectric layer 136 is formed (e.g., step 24 above) using an oxidation process 138 at an elevated temperature for a short duration, for example, using a temperature of about 1000 degrees C. or more for a duration of about 60 seconds or less. Thereafter in FIG. 11, a gate contact layer 140 is formed over the wafer using conductive metal or polysilicon or other suitable material to any desired thickness. In FIG. 12, the gate contact layer 140, and the gate oxide layer 136 are patterned to form a transistor gate structure using a mask 142 and an etch process 144.

Figure 13:
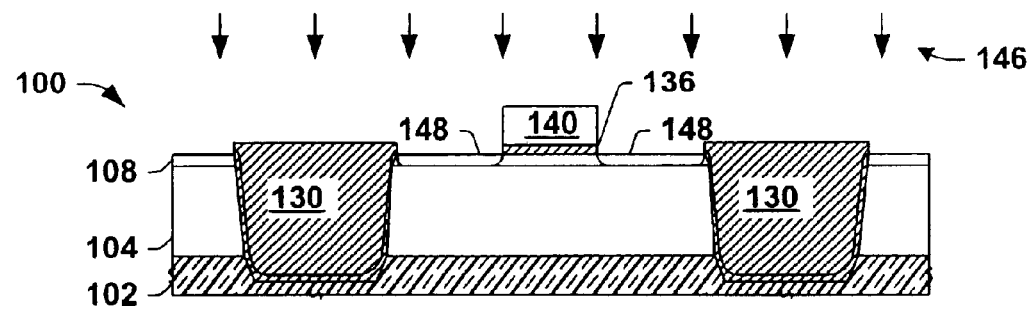
FIG. 13 is a partial side elevation view in section illustrating performance of one or more LDD implants in the device of FIGS. 2–12.
Figure 14:
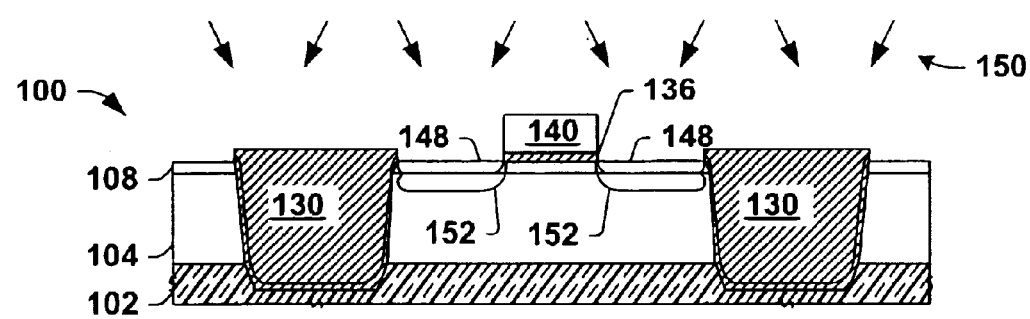
FIG. 14 is a partial side elevation view in section illustrating performance of one or more halo or pocket implants in the device of FIGS. 2–13.
Figure 15:
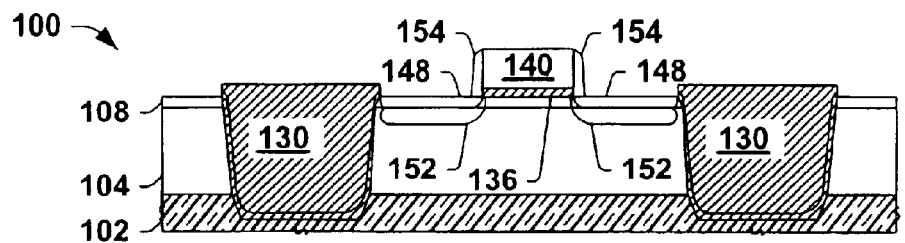
FIG. 15 is a partial side elevation view in section illustrating formation of gate sidewall spacers in the device of FIGS. 2–14.
Figure 16:
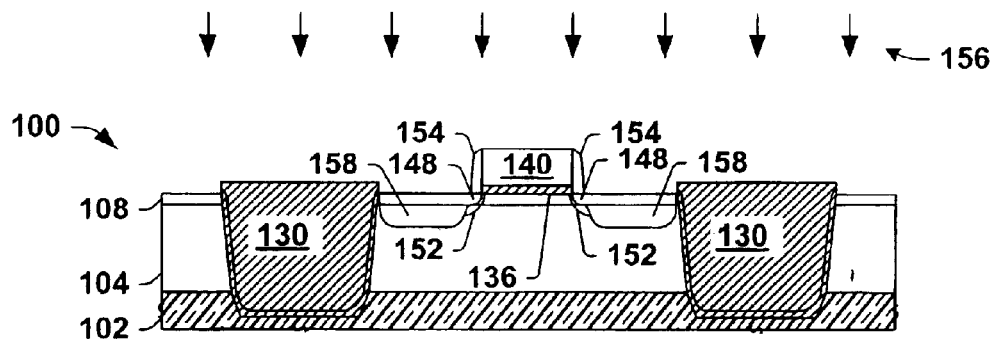
FIG. 16 is a partial side elevation view in section illustrating performance of one or more source/drain implants in the device of FIGS. 2–15.
Figure 17:
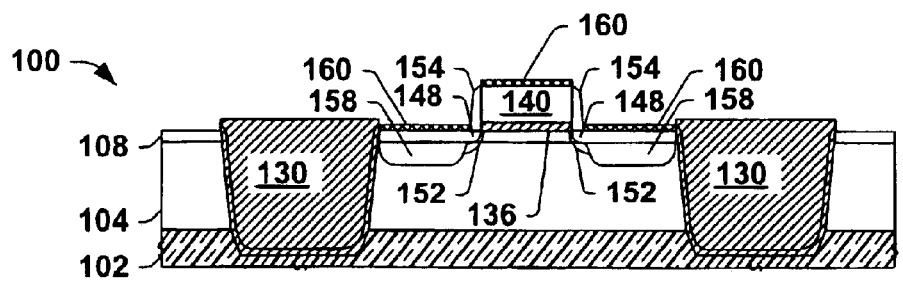
FIG. 17 is a partial side elevation view in section illustrating formation of silicide contacts at the source/drains and the gate of the device of FIGS. 2–16.

In FIG. 13, one or more LDD implants 146 are performed to provide dopants to prospective source/drain regions on either side of the gate structure. In the exemplary NMOS device, phosphorus or arsenic dopants are implanted into LDD regions 148 on either side of the NMOS gate structure. In FIG. 14, pocket or halo implantation processes 150 are performed to form oppositely doped (e.g., p-type) pockets 152 between the implanted (e.g., n-type) LDD regions 148 and the device channel underlying the gate oxide 136. Thereafter in FIG. 15, sidewall spacers 154 are formed along the gate sidewalls, and in FIG. 16, source/drain implantation processes 156 are performed to provide n-type dopants to source/drain regions 158. In FIG. 17, silicide contacts 60 are formed over the source/drain regions 158 and the gate contact 140, whereafter further interconnect processing is performed (not shown) to complete the device 100.

Although the invention has been illustrated and described with respect to one or more implementations, alterations and/or modifications may be made to the illustrated examples without departing from the spirit and scope of the appended claims. In particular regard to the various functions performed by the above described components or structures (assemblies, devices, circuits, systems, etc.), the terms (including a reference to a "means") used to describe such components are intended to correspond, unless otherwise indicated, to any component or structure which performs the specified function of the described component (e.g., that is functionally equivalent), even though not structurally equivalent to the disclosed structure which performs the function in the herein illustrated exemplary implementations of the invention. In addition, while a particular feature of the invention may have been disclosed with respect to only one of several implementations, such feature may be combined with one or more other features of the other implementations as may be desired and advantageous for any given or particular application. Furthermore, to the extent that the terms "including", "includes", "having", "has", "with", or variants thereof are used in either the detailed description and the claims, such terms are intended to be inclusive in a manner similar to the term "comprising."

What is claimed is:

1. A method of fabricating a semiconductor device in a wafer, comprising:
    forming a carbon-containing region in the wafer; and
    performing at least one front-end oxidation or anneal process using a high temperature, short duration thermal process to mitigate out-diffusion of carbon from the carbon-containing region during front-end fabrication processing.

2. The method of claim 1, wherein forming the carbon-containing region comprises implanting carbon or a carbon-containing species in the wafer.

3. The method of claim 1, wherein forming the carbon-containing region comprises growing an epitaxial carbon-containing layer over a semiconductor body.

4. The method of claim 3, further comprising growing an epitaxial silicon cap layer over the carbon-containing layer.

5. The method of claim 1, wherein performing at least one front-end oxidation or anneal process using a high temperature, short duration thermal process comprises forming a pad oxide layer using an oxidation process at a temperature of about 1000 degrees C. or more for a duration of about 60 seconds or less.

6. The method of claim 5, wherein the oxidation process is performed at a temperature of about 1050 degrees C. or more.

7. The method of claim 5, wherein the oxidation process is performed at a temperature of about 1100 degrees C. or more.

8. The method of claim 5, wherein the oxidation process is performed for a duration of about 30 seconds or less.

9. The method of claim 5, wherein the oxidation process is performed at a pressure of about 10 Torr or less.

10. The method of claim 1, wherein the at least one front-end oxidation or anneal process is performed at a pressure of about 10 Torr or less.

11. The method of claim 1, wherein performing at least one front-end oxidation or anneal process using a high temperature, short duration thermal process comprises forming a liner oxide layer during a shallow trench isolation process using an oxidation process at a temperature of about 1000 degrees C. or more for a duration of about 60 seconds or less.

12. The method of claim 11, wherein the oxidation process is performed at a temperature of about 1050 degrees C. or more.

13. The method of claim 11, wherein the oxidation process is performed at a temperature of about 1100 degrees C. or more.

14. The method of claim 11, wherein the oxidation process is performed for a duration of about 30 seconds or less.

15. The method of claim 11, wherein the oxidation process is performed at a pressure of about 10 Torr or less.

16. The method of claim 1, wherein performing at least one front-end oxidation or anneal process using a high temperature, short duration thermal process comprises forming a gate oxide layer using an oxidation process at a temperature of about 1000 degrees C. or more for a duration of about 60 seconds or less.

17. The method of claim 16, wherein the oxidation process is performed at a temperature of about 1050 degrees C. or more.

18. The method of claim 16, wherein the oxidation process is performed at a temperature of about 1100 degrees C. or more.

19. The method of claim 16, wherein the oxidation process is performed for a duration of about 30 seconds or less.

20. The method of claim 16, wherein the oxidation process is performed at a pressure of about 10 Torr or less.

21. The method of claim 16, wherein performing at least one front-end oxidation or anneal process further comprises forming a pad oxide layer using an oxidation process at a temperature of about 1000 degrees C. or more for a duration of about 60 seconds or less.

22. The method of claim 21, wherein performing at least one front-end oxidation or anneal process further comprises forming a liner oxide layer during a shallow trench isolation process using an oxidation process at a temperature of about 1000 degrees C. or more for a duration of about 60 seconds or less.

23. The method of claim 22, wherein performing at least one front-end oxidation or anneal process further comprises performing a channel implant damage anneal process at a temperature of about 1050 degrees C. or more for a duration of about 60 seconds or less.

24. The method of claim 16, wherein performing at least one front-end oxidation or anneal process further comprises forming a liner oxide layer during a shallow trench isolation process using an oxidation process at a temperature of about 1000 degrees C. or more for a duration of about 60 seconds or less.

25. The method of claim 1, wherein performing at least one front-end oxidation or anneal process further comprises performing a channel implant damage anneal process at a temperature of about 1050 degrees C. or more for a duration of about 60 seconds or less.

26. The method of claim 1, wherein the carbon-containing region extends into at least a portion of one of a shallow junction extension region, a deep source/drain region, and a doped gate structure.

27. A method of fabricating a semiconductor device in a wafer, comprising:
    forming a carbon-containing region in the wafer; and
    forming at least one of a pad oxide layer, a liner oxide layer, and a gate oxide layer over said carbon-containing region by performing an oxidation process at a temperature of about 1000 degrees C. or more and a pressure of about 10 Torr or less for a duration of about 60 seconds or less to mitigate out-diffusion of carbon from the carbon-containing region during front-end fabrication processing.

28. The method of claim 27, wherein the oxidation process is performed at a temperature of about 1050 degrees C. or more.

29. The method of claim 27, wherein the oxidation process is performed at a temperature of about 1100 degrees C. or more.

30. The method of claim 27, wherein the oxidation process is an in-situ steam generation oxidation process.

31. The method of claim 27, wherein the oxidation process is performed at a temperature of about 1000 degrees C. or more for a duration of about 30 seconds or less.

32. The method of claim 27, wherein the carbon-containing region extends into at least a portion of one of a shallow junction extension region, a deep source/drain region, and a doped gate structure.

33. A method of fabricating a semiconductor device in a wafer, comprising:
    forming a carbon-containing region in the wafer; and
    performing an anneal process at a temperature of about 1050 degrees C. or more and a pressure of about 10 Torr or less for a duration of about 60 seconds or less to mitigate out-diffusion of carbon from the carbon-containing region during front-end fabrication processing.

34. The method of claim 33, wherein the anneal process is performed at a temperature of about 1100 degrees C. or more for a duration of about 60 seconds or less.

35. The method of claim 33, wherein the anneal process is performed at a temperature of about 1100 degrees C. or more for a duration of about 30 seconds or less.

36. The method of claim 33, wherein the anneal process is performed at a temperature of about 1100 degrees C. or more for a duration of about 30 seconds or less.

37. The method of claim 33, wherein the anneal process is an in-situ steam generation anneal process.

38. The method of claim 33, wherein the carbon-containing region extends into at least a portion of one of a shallow junction extension region, a deep source/drain region, and a doped gate structure.

* * * * *